US012631696B2

(12) United States Patent
Schulz

(10) Patent No.: US 12,631,696 B2
(45) Date of Patent: May 19, 2026

(54) DEVICE FOR DETECTING FAULTS IN HIGH-VOLTAGE TRANSMISSION LINES

(71) Applicant: Kries Energietechnik Gmbh & Co. KG, Waiblingen (DE)

(72) Inventor: Jonathan Schulz, Waiblingen (DE)

(73) Assignee: Kries Energietechnik GmbH & Co. KG, Waiblingen (DE)

( * ) Notice: Subject to any disclaimer, the term of this patent is extended or adjusted under 35 U.S.C. 154(b) by 230 days.

(21) Appl. No.: 18/512,253

(22) Filed: Nov. 17, 2023

(65) Prior Publication Data

US 2025/0164579 A1     May 22, 2025

(51) Int. Cl.
 *G01R 31/58* (2020.01)
 *H01Q 1/22* (2006.01)

(52) U.S. Cl.
 CPC .............. *G01R 31/58* (2020.01); *H01Q 1/22* (2013.01)

(58) Field of Classification Search
 CPC ...... G01R 31/00; G01R 31/08; G01R 31/081; G01R 31/085; G01R 31/50; G01R 31/58; G01R 15/00; G01R 15/14; G01R 15/142; H01Q 1/00; H01Q 1/12; H01Q 1/22
 USPC ......................................... 324/500, 537, 543
 See application file for complete search history.

(56) References Cited

U.S. PATENT DOCUMENTS

| | | | | |
|---|---|---|---|---|
| 4,827,272 | A * | 5/1989 | Davis | H01Q 1/46 |
| | | | | 343/702 |
| 6,452,477 | B1 * | 9/2002 | Roca | H05G 1/54 |
| | | | | 338/261 |
| 10,698,010 | B2 * | 6/2020 | Keister | G01R 19/2513 |
| 2008/0246507 | A1 * | 10/2008 | Gunn | H02G 7/00 |
| | | | | 324/764.01 |
| 2018/0321285 | A1 * | 11/2018 | Keister | G06F 1/26 |

FOREIGN PATENT DOCUMENTS

| | | | | | |
|---|---|---|---|---|---|
| CN | 100527032 | C | * | 8/2009 | |
| CN | 107179475 | A | * | 9/2017 | .......... B64C 39/024 |
| CN | 107219441 | A | * | 9/2017 | ....... H04M 1/72403 |
| CN | 210604849 | U | * | 5/2020 | .......... G01R 31/08 |
| CN | 114843936 | A | * | 8/2022 | ........... B65H 75/28 |
| CN | 115548649 | A | * | 12/2022 | ............ H01Q 5/20 |
| EP | 4004569 | B1 | * | 8/2023 | .......... G01R 31/16 |
| JP | 2781551 | B2 | * | 7/1998 | ............. H04B 1/38 |
| JP | 2010071685 | A | * | 4/2010 | ........... G01R 31/12 |
| WO | WO-2019092247 | A1 | * | 5/2019 | ........... B61L 27/40 |
| WO | WO-2023049049 | A1 | * | 3/2023 | .......... H05K 7/2039 |

* cited by examiner

*Primary Examiner* — Hoai-An D. Nguyen
(74) *Attorney, Agent, or Firm* — Barley Snyder

(57) ABSTRACT

A device for detecting faults includes a body attachable to a high-voltage transmission line and having a first housing part made of a conductive plastic, a plurality of electronics disposed within the body and identifying a potential fault in the high-voltage transmission line, and a clamping mechanism electrically connecting the first housing part to the high-voltage transmission line. The device has an antenna connected to the electronics that extends from the body and transmits a fault notification signal to a central station. A corona ring of the device is positioned around and proximal to a tip of the antenna. The corona ring is connected to a ground of the electronics.

20 Claims, 3 Drawing Sheets

DEVICE FOR DETECTING FAULTS IN HIGH-VOLTAGE TRANSMISSION LINES

FIELD OF THE INVENTION

The present application relates to a device for detecting faults in high-voltage transmission lines, in particular with an enhanced voltage range antenna with integrated corona ring.

BACKGROUND

High-voltage transmission lines are the arteries of our modern power grid. Their smooth operation is essential to providing uninterrupted power to homes, industry and critical facilities. A malfunction or fault in these lines can result in power outages, damage to equipment, and even safety hazards.

Fault indicators are used to monitor and detect faults in these transmission lines in real time. As tools that continuously monitor the health of the transmission lines, they play a key role in the timely detection and reporting of any discrepancies or faults to a central control station, ensuring rapid corrective action.

However, an obvious dilemma presented by the prior art is the challenge associated with positioning the antenna within these fault indicators. The role of the antenna in this context cannot be underestimated. It acts as a communication bridge, transmitting the detected fault data from the fault indicator to the central workstation. This data transmission must be not only timely, but also accurate. Any delay or error in this communication can result in inadequate response times and, in some cases, even escalation of the fault.

To achieve the desired communication efficiency, the positioning and design of the antenna is of paramount importance. It must be positioned and designed to be elongated, and away from the fault indicator's internal electronics. This positioning and design minimizes interference and optimizes signal transmission.

However, this optimal positioning and design of the antenna comes with its own set of challenges. The very positioning and design that ensures efficient communication is also a potential risk factor for partial discharge.

Sharp edges and therefore exposed antenna tips, while providing better communication efficiency, inadvertently become sites of high electric field concentration. In high-voltage systems, these locations are particularly susceptible to partial discharges. This phenomenon can be visualized as sparks that occur either within the insulation, due to gas pockets or other imperfections, or on the surface of the insulation, especially around the sharp protrusions of the antenna.

This creates a dilemma for designers and engineers. While maintaining effective communication is a priority, it is equally important to ensure the longevity and safety of the equipment. The risks associated with partial discharge, such as equipment degradation, increased maintenance costs and potential safety hazards, cannot be ignored.

Historically, there have been attempts to mitigate the risks associated with partial discharge. Some solutions have focused on redesigning the antenna, while others have looked at improving the insulation material or even adding protective elements around the antenna. However, each of these solutions comes with its own set of challenges and trade-offs.

For example, redesigning the antenna to eliminate sharp edges could compromise its ability to communicate. Similarly, improving insulation could reduce the risk of partial discharges, but it could also add bulk or cost to the device. Protective elements, on the other hand, could add complexity to the installation process and also affect the overall aesthetics of the device.

In summary, the challenge facing prior art fault indicators is multifaceted. While antenna design and positioning are critical to ensuring effective communication, they also increase the risk of partial discharges. There is a need to balance these conflicting requirements and find a solution that ensures both efficient communication and device safety.

SUMMARY

A device for detecting faults includes a body attachable to a high-voltage transmission line and having a first housing part made of a conductive plastic, a plurality of electronics disposed within the body and identifying a potential fault in the high-voltage transmission line, and a clamping mechanism electrically connecting the first housing part to the high-voltage transmission line. The device has an antenna connected to the electronics that extends from the body and transmits a fault notification signal to a central station. A corona ring of the device is positioned around and proximal to a tip of the antenna. The corona ring is connected to a ground of the electronics.

BRIEF DESCRIPTION OF THE DRAWINGS

In the following detailed portion of the present description, the teachings of the present application will be explained in more detail with reference to the example embodiment shown in the drawings, in which.

DETAILED DESCRIPTION OF THE EMBODIMENT(S)

The importance of having a dedicated device that can quickly detect faults in high-voltage transmission lines cannot be overstated. Ensuring that faults are detected and reported immediately not only maintains the efficiency and reliability of the power distribution system, but also prevents potential hazards that could escalate into significant damage or service interruptions.

While the primary design focuses on overhead transmission lines 2, the device 1 described below is not limited to this application. Its modular design ensures that it can be adapted for use on different types of high-voltage transmission lines, including underground lines. This adaptability makes the device 1 versatile and widely applicable.

Figure 1:
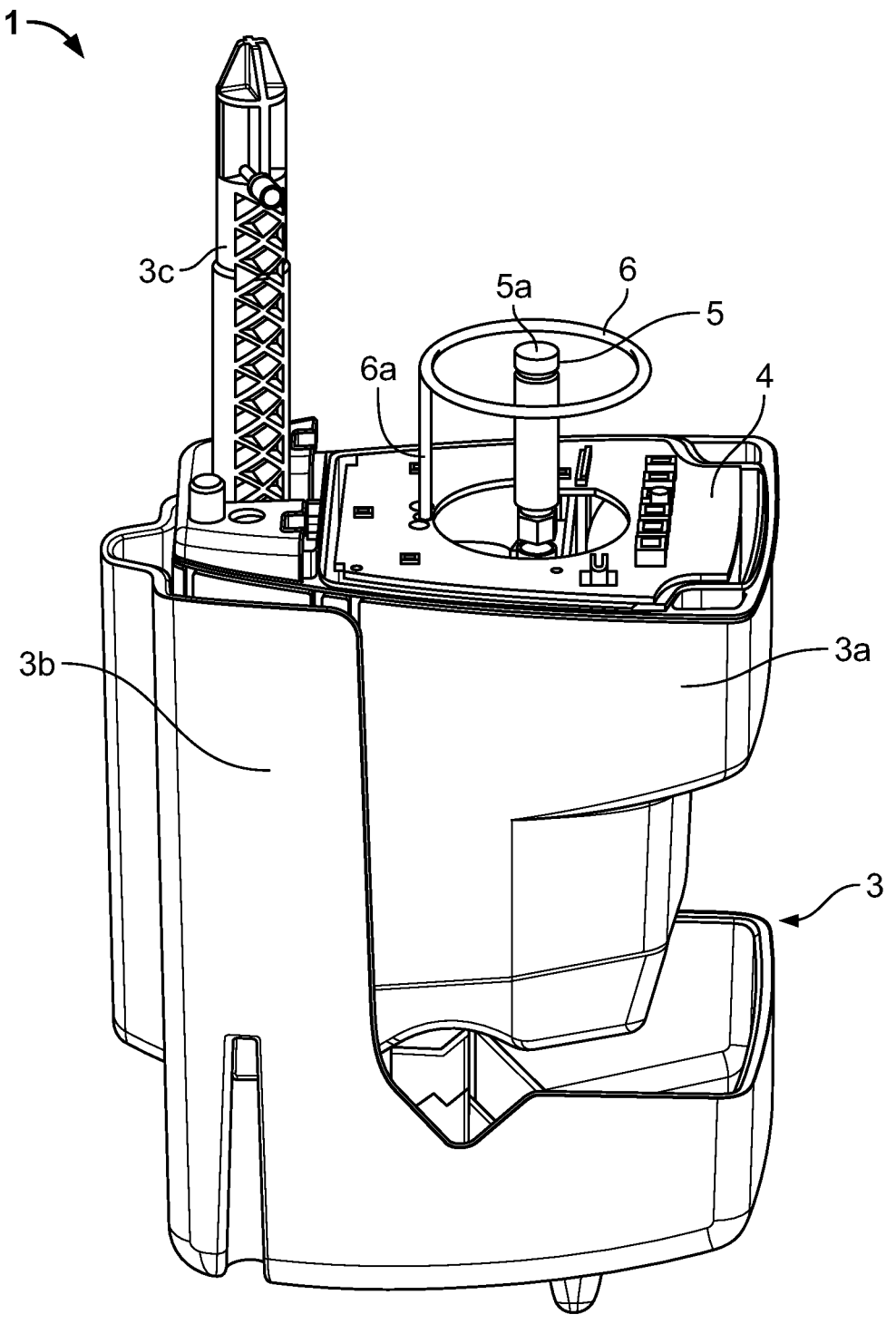
FIG. 1 is a perspective view of the underside of a device for detecting faults in high-voltage transmission lines according to an embodiment, with the cover enclosing the antenna and corona ring removed for illustrative clarity.
Figure 2:
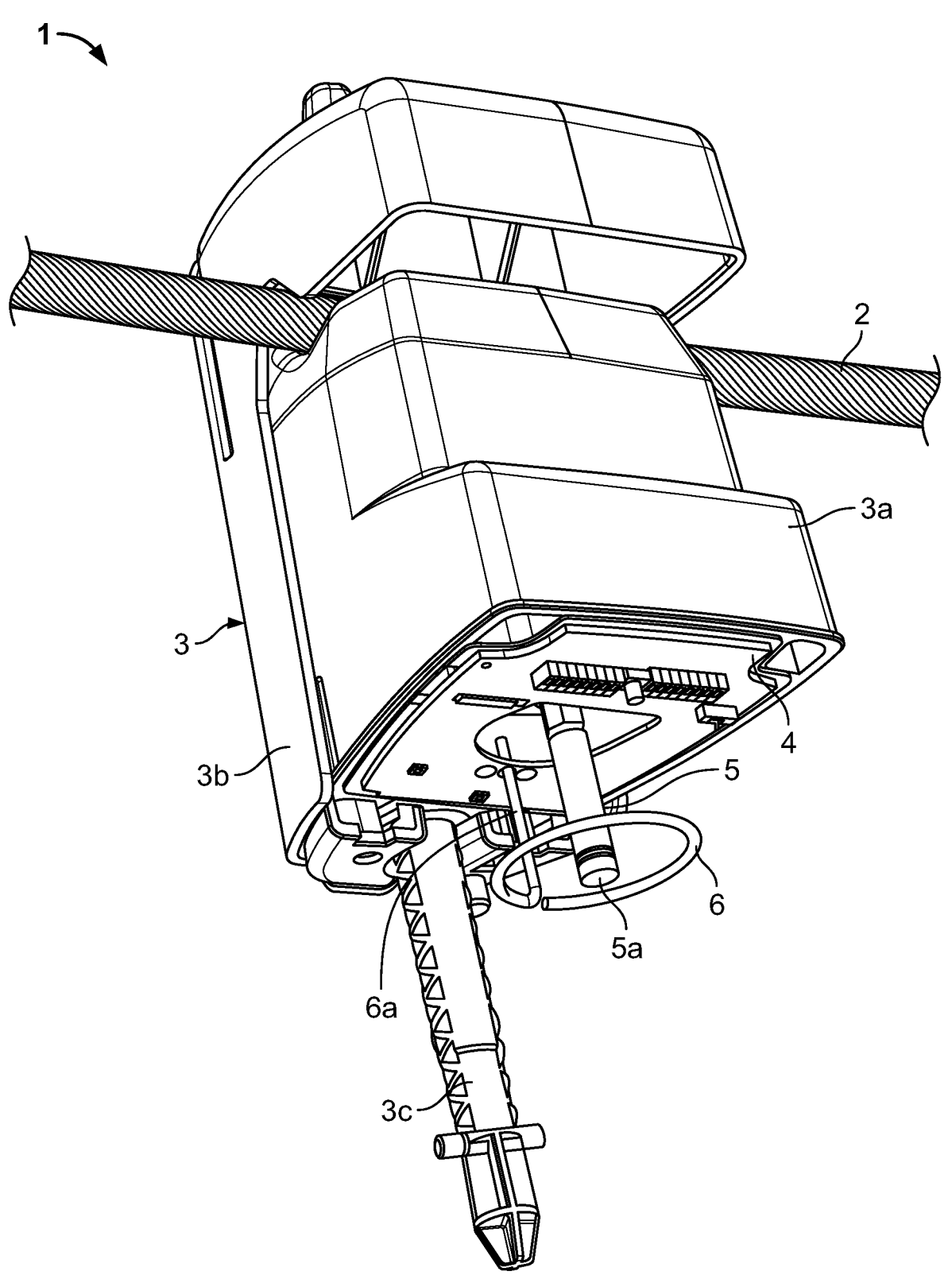
FIG. 2 shows the device of FIG. 1 in a condition in which it is installed on an overhead transmission line, with the cover enclosing the antenna and corona ring still removed for illustrative clarity.
Figure 3:
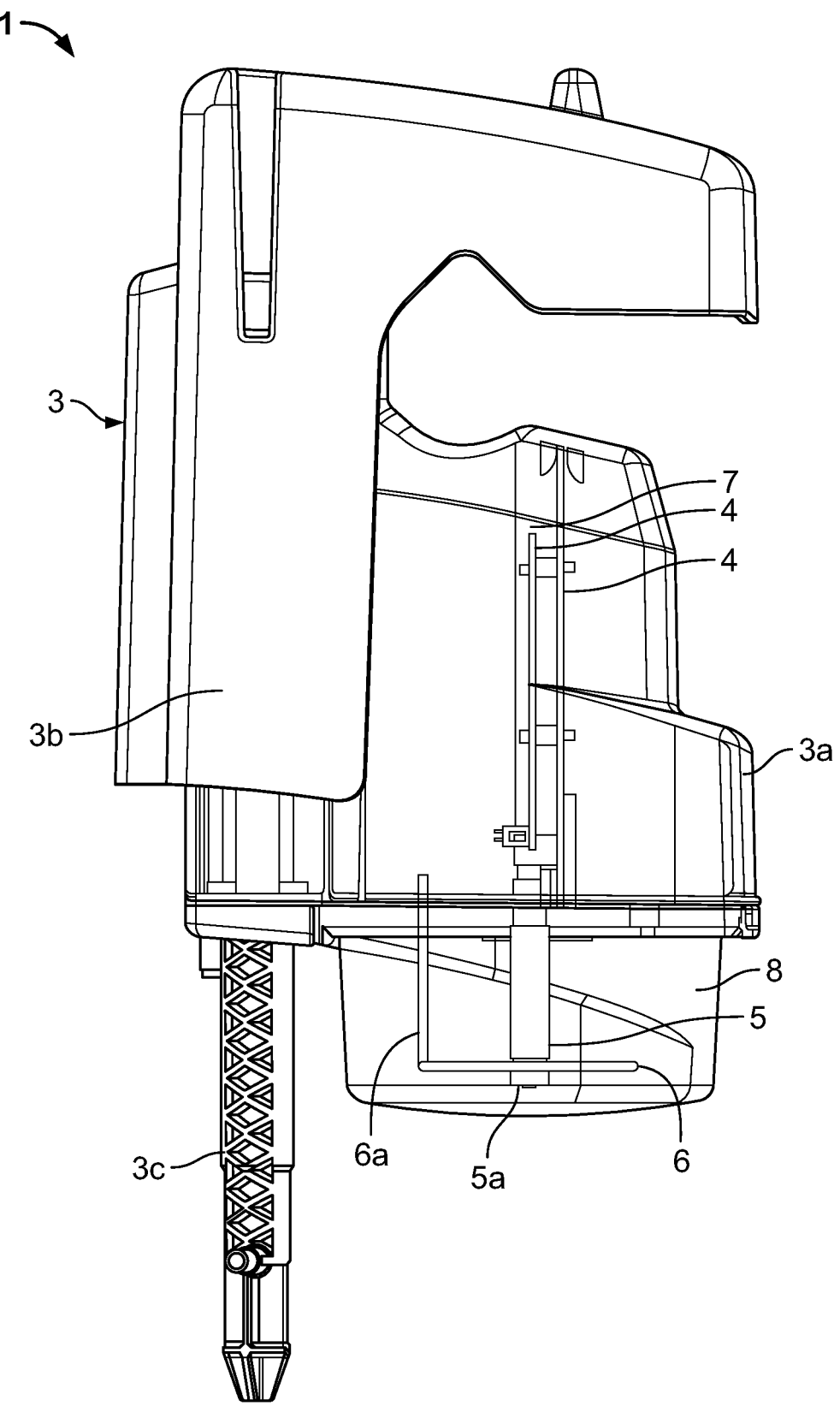
FIG. 3 is a side view of the device of FIG. 1 oriented for attachment to an overhead transmission line as shown in FIG. 2.

The body 3 of the device 1, shown in FIGS. 1-3, plays a role in structural integrity, and also in functionality and adaptability. As the main structural component, the body 3 is designed to withstand the various environmental factors it may encounter. Whether it is exposed to the elements on a catenary or underground, it remains rugged and durable. The body 3 is designed for easy attachment to high-voltage transmission lines 2. This is especially important for maintenance crews, who can install and remove the device 1 quickly and easily, reducing the time and resources required for setup.

The electronics compartment 7, shown in FIG. 3, is the nerve center of the device 1 for detecting faults in high-voltage transmission lines 2. It houses the critical components responsible for the primary function of the device 1, which is fault detection. The electronics 4 within this compartment 7 are intricately interconnected and consist of sensors, microcontrollers, and communication modules. These components work together to detect irregularities and communicate the information to the central station via antenna 5. The electronics 4 are equipped with advanced sensing mechanisms that can immediately detect even small fluctuations or deviations in the transmission line 2. This ensures rapid fault detection and minimizes potential downtime.

A clamping mechanism ensures that a first housing part 3a of the body 3 is electrically connected to the overhead transmission line 2. The first housing part 3a is made of a conductive plastic. In an embodiment, the first housing part 3a has a plurality of conductive elements embedded in a plastic body of the first housing part 3a. In an embodiment, the conductive elements may be a plurality of carbon fibers embedded in the plastic body, which may be a polyamide. In an embodiment, the first housing part 3a is a low-conductive plastic. The term "low-conductive" as used throughout the specification means that a volume resistivity of the material of the first housing part 3a is within 25% of $2.00 \times 10^3$ ohm-m, and a surface resistivity is within 25% of $4.00 \times 10^4$ ohm.

Under standard operational protocols, the device 1 should exclusively be manipulated using tools or equipment with dielectric properties to mitigate the risk of electrocution. During operation, the first housing part 3a, fabricated from the low-conductive plastic, acts as a dielectric barrier for the internal circuitry (electronics 4), thereby insulating it against the intense electric fields emanating from the line 2. Connecting the first housing part 3a of the device 1 to the line 2 provides a more stable reference point for the device 1 to measure and detect anomalies in the line 2. This is essential for safety reasons and to ensure accurate fault detection. Grounding the device 1 to the line 2 can also help reduce electromagnetic noise and interference in the system. This is critical for the device 1 to operate accurately, especially since overhead transmission lines 2 can be a source of significant electromagnetic interference.

The antenna 5, shown in FIGS. 1-3, is a crucial component in the device 1 for detecting faults in high-voltage transmission lines 2, bridging the gap between the location of the fault and the central control systems that can respond to it. Accordingly, the primary function of the antenna 5 in the fault detection device 1 is to transmit a fault notification signal that notifies the central station of a fault. This ensures that necessary actions, like rerouting power or dispatching repair crews, can be initiated promptly. The antenna 5 can also receive signals from the central station or other nodes in the network. This bidirectional communication allows for system updates, synchronization, or even remote diagnostics. The antenna 5 should be designed to operate efficiently at the specific frequency or frequencies corresponding to the communications standard(s) adopted by the fault detection device 1.

The corona ring 6, which can also be called a grading ring or corona shield, is an integral part of the device 1, as shown in FIGS. 1-3, which is specifically designed for high-voltage applications. Its primary function is to ensure stable operation of the device 1 by reducing the risk associated with partial discharges. The antenna tip 5a in device 1 is a potential hazard due to its sharp point or edge. Such designs can inadvertently cause the electric field to be concentrated at this point or edge. The corona ring 6 around and proximal to the antenna tip 5a has a smooth and rounded design. This is intentional because it helps lowering the concentrated electric field intensity around the antenna tip 5a, by homogenizing the electric field at this critical point or edge.

The corona ring 6, clearly visible in the device 1 of FIGS. 1-3, is strategically placed near and around the antenna tip 5a. This placement is critical to its function and effectiveness. Constructed of conductive materials, in an embodiment copper, the corona ring 6 is protective. One of the primary functions of the corona ring 6 is to prevent partial discharges, a phenomenon that can be catastrophic to high-voltage equipment. The presence of the corona ring 6 helps ensure that these unwanted discharges are kept at bay. In the shown embodiment, the corona ring 6 is a closed circle concentric to the antenna 5.

As a result, the inclusion of the corona ring 6 allows the device 1 to operate at significantly higher voltages, up to 69 kV in an embodiment instead of 30 kV. This extended range is a testament to the protective effectiveness of the corona ring 6. The corona ring 6 allows the antenna 5 to be extended vertically further away from the electronics 4, ensuring that it is optimally positioned for signal transmission. This optimal position and design allows the antenna 5 to transmit clear, interference-free signals, enhancing the communication capabilities of the device 1.

The importance of the corona ring 6 is discussed in more detail below, particularly in the context of overcoming the partial discharge problem and its implications for optimal antenna positioning and increased voltage range for device 1.

Before explaining the role of the corona ring 6, it is important to understand the problem it addresses. In high-voltage scenarios, such as overhead transmission lines 2, the phenomenon known as "partial discharge" often occurs. This is a localized dielectric breakdown of a small portion of a solid or fluid electrical insulation system under high voltage stress, resulting in the ionization of localized regions in the insulation material. When this occurs, it produces small electrical sparks and can be a precursor to electrical breakdown and failure.

Partial discharge not only degrades insulation over time, it also emits electromagnetic radiation, creating radio frequency noise. For a fault detection device 1 that relies heavily on communication capabilities, this electromagnetic interference can severely degrade the clarity and reliability of fault notification signals transmitted through the antenna 5.

The corona ring 6, typically made of a good conductor such as copper, plays a key role in combating the partial discharge phenomenon. When placed around and near the tip 5a of the antenna 5, the corona ring 6 acts as a gradient control, distributing the electric field more evenly across the insulating material. This uniform distribution greatly reduces voltage stress concentrations, which are the primary culprits for the initiation of partial discharges.

The corona ring 6 is connected to the ground of the electronics 4 via a branch 6a extending parallel to the antenna 5, as shown in FIGS. 1-3. This branch 6a allows the antenna 5 to be further away from the electronics 4. This separation ensures that the antenna 5 is positioned away from potential electromagnetic interference from the internal electronics 4. In addition, by connecting the corona ring 6 to the ground of the electronics 4 via the branch 6*a*, the potential of the ring 6 is kept at ground potential, further ensuring a uniform electric field without sharp gradients or points of high electric field intensity that can lead to partial discharge. This protective mechanism not only ensures equipment longevity, but also prevents potential malfunctions.

Moreover, by reducing the likelihood of partial discharge events, the corona ring 6 ensures that the electromagnetic interference typically caused by such discharges is minimized. This means that the antenna 5, which is central to the communication capability of the fault detection device 1, can operate with minimal interference, ensuring clear and timely fault notifications.

With the corona ring 6 in place, the antenna 5 can be optimally positioned and configured to ensure excellent communication capability. In high-voltage environments, positioning and configuring the antenna 5 without the corona ring 6 would have required certain compromises to avoid partial discharge effects, such as abandoning the optimal positioning and configuration of the antenna 5. However, with the corona ring 6, the antenna 5 can be placed in a position and constructed with a configuration that ensures minimal electromagnetic interference, resulting in clearer signals and better communication range.

Another significant benefit of the corona ring 6 is its effect on the operating voltage range of the device 1. By effectively mitigating the partial discharge problem, the device 1 can tolerate and operate efficiently in higher voltage environments. The corona ring 6 increases the allowable voltage threshold of the device 1, allowing it to operate in scenarios with line voltages as high as 69 kV, as mentioned earlier. This expands the range of high-voltage transmission lines 2 to which the device 1 can be applied, making it more versatile and adaptable.

In summary, the corona ring 6 is not just a passive component; it is a strategic inclusion that addresses a fundamental challenge in high-voltage environments. By effectively combating the phenomenon of partial discharge, the corona ring 6 ensures that the device's antenna 5 operates optimally, resulting in improved communication capabilities and a wider operating voltage range. This not only increases the efficiency of the device 1, but also extends its life by reducing wear and tear on its components. This results in lower maintenance costs and longer replacement intervals.

The clip or clamp shape of the body 3 (see FIG. 3) ensures quick and easy installation. Unlike other mounting mechanisms that may require multiple steps, special tools or additional components, the clip or clamp can be quickly attached to the overhead transmission line 2 (see FIG. 2), reducing setup time. This not only saves time, but also minimizes personnel exposure to high-voltage environments, improving safety. This shape eliminates the need for complex tools or specialized training, enabling even relatively untrained personnel to install the device with minimal hassle. In emergency situations or during routine checks, technicians can quickly deploy or replace fault detection devices without going through time-consuming procedures, enhancing the efficiency of field operations.

The body configuration is further refined by incorporating the first housing part 3*a* made of low-conductive plastic. In addition to its protective function, this housing part 3*a* forms the electronics compartment 7, which houses the critical fault-detection electronics 4. It also acts as a Faraday cage, shielding the internal electronics 4 from any external electromagnetic interference (EMI) and ensuring their optimal operation. By acting as a barrier to these disturbances, the first housing part 3*a* ensures that the device's electronics 4 can function without external interference, resulting in accurate and consistent fault detection. This ensures that the device can operate reliably in the electromagnetically noisy environment typical of high-voltage transmission lines.

Building on the protective design, the body 3 also includes a second housing part 3*b*. Constructed of non-conductive plastic, this part 3*b* provides the advantage of additionally shielding the electronics compartment 7 from environmental elements such as dust, rain, or snow. This is crucial for fault detection devices that are exposed to the outdoors in varying weather conditions. In addition, the non-conductive nature of the second housing part 3*b* provides an added layer of electrical insulation, minimizing the risk of electrical discharge or shorts when in proximity to high-voltage transmission lines 2.

Furthermore, device 1 features a third housing part 3*c*, characterized by a spindle or helix shape, which projects vertically downward from the second housing part 3*b*, when the device 1 is affixed to the overhead transmission line 2, as illustrated in FIG. 2. This third housing part 3*c* is engineered as an anchoring mechanism, designed to interface with an operating rod, which facilitates the secure and safe mounting or dismounting of device 1. It is envisioned that third housing part 3*c* could be equipped with a ring eyelet that the operating rod engages with, allowing for the device 1 to be tightly secured to, or released from, the overhead transmission line 2.

Protection extends beyond the interior of the body 3. An external cover 8 made of non-conductive plastic is attached to the body 3 (see FIG. 3). Its purpose is twofold—to encapsulate and protect the vital antenna 5 and corona ring 6. As with the housing parts 3*b* and 3*c* of the body 3, the choice of non-conductive plastic for the cover 8 ensures that the antenna 5 and the corona ring 6 remain isolated despite their proximity to high-voltage transmission lines 2, thus reducing the risk of electrical interference or accidental short circuits. Furthermore, the chosen non-conductive plastic for the protective cover 8 may be transparent, as illustrated in the embodiment of FIG. 3, to facilitate the passage of light from high-powered LED indicators through the cover 8. This design feature allows the LEDs to visibly indicate the activation of an alarm, which occurs upon the detection of a fault in the high-voltage transmission line 2.

By using a battery as a power source, the device 1 can operate independently without requiring an external power supply. Since the battery is housed within the electronics compartment 7, it benefits from the protective features of the compartment 7, such as the shielding provided by the Faraday cage. An alternative power source approach is to draw power directly from the high-voltage transmission line 2. Tapping into the high-voltage transmission line 2 may seem risky, but the mechanism for harvesting energy from the high-voltage transmission line 2 would employ a multi-layered safety system to convert and regulate the harvested energy to levels that are safe for the device's electronics 4.

The orientation and location of the antenna 5 on the body 3 of the device 1 was also chosen with a clear intention.

The vertical orientation of the antenna 5 (in a state where the device 1 is installed on the overhead transmission line 2, see FIG. 2) serves several purposes. A vertically oriented antenna 5 typically provides an omnidirectional radiation pattern in the horizontal plane, making it well suited for radiating signals in multiple directions. This is critical to ensure that the central station can receive fault notification signals from any orientation or position relative to the fault detection device 1.

By placing the antenna 5 at the distal lower end of the body 3, it is kept as far away as possible from the high-voltage transmission line 2 to which the device 1 is attached (see FIG. 2). This deliberate distance serves to minimize the electromagnetic interference received from the transmission line 2, which can be quite significant given the high voltages and currents associated with such lines.

By supporting multiple communications standards like 2G, 3G, 4G, 4G LTE, 5G, and Wi-Fi, the device 1 ensures its relevance in various operational environments. Whether in a rural setting with limited 5G infrastructure or an urban landscape, the device 1 can adapt and function optimally. 4G and 4G LTE represent the fourth generation of cellular network technology.

While 4G is widely adopted and offers good speed and coverage, 4G LTE (Long-Term Evolution) is a step further, providing even faster data rates and more reliable connections. The inclusion of these standards ensures that the device 1 can function effectively in regions where these are the dominant communication methods.

Copper is renowned for its exceptional electrical conductivity. In the context of the corona ring 6, this high conductivity ensures an even distribution of the electric field around the device 1. A closed circular design ensures that the electric field is evenly distributed around the circumference of the corona ring 6. This symmetry helps in effectively mitigating the localized high electric field gradients that could lead to partial discharge. By forming a continuous loop, the corona ring 6 offers consistent protection, with no gaps that might compromise its effectiveness in combating the partial discharge phenomenon.

As a result of the above, the device 1 is capable of operating at voltages up to 69 kV in some embodiments. A tolerance of up to 69 kV indicates that the device 1 is equipped to handle the electrical stresses and potential disturbances associated with high-voltage transmission lines 2. This tolerance level ensures that the device 1 can withstand voltage surges or spikes without malfunction. In addition, the ability to operate on lines 2 up to 69 kV means that the device 1 can be used in a wide variety of power distribution setups. Whether it is urban infrastructure with dense power demands or rural areas with dispersed networks, the device's high voltage tolerance ensures its applicability in different scenarios.

The device 1 can be used as a fault indicator, which typically signals when a fault such as a short circuit or open circuit occurs in the electrical system, and/or as a measuring device, which measures various parameters such as voltage, current, or temperature and requires accurate data collection. The ability of the device 1 to mitigate the effects of partial discharges means that it can operate effectively and provide reliable readings even in the harsh and electrically noisy environments found on high-voltage transmission lines. It can also perform optimally in the outdoor environments typical of overhead transmission lines 2.

In conclusion, the device 1 provides an effective and reliable solution for fault detection in high-voltage transmission lines 2. Its design considerations ensure that it not only performs its primary function with accuracy, but also offers flexibility, longevity, and adaptability in different scenarios and conditions. Reduced risk of partial discharge means reduced risk of arcing, sparking, and potential fire hazards. The corona ring 6 improves the safety profile of the fault detection device by its design and location. As a passive component, the corona ring 6 can be easily integrated into existing fault detection device designs without significant changes to the electronics or functionality.

Although the teaching of the present application has been described in detail for purpose of illustration, it is understood that such detail is solely for that purpose, and variation can be made therein by those skilled in the art without departing from the scope of the teaching of this application.

What is claimed is:

1. A device for detecting faults, comprising:
   a body attachable to a high-voltage transmission line and having a first housing part made of a conductive plastic;
   a plurality of electronics disposed within the body and identifying a potential fault in the high-voltage transmission line;
   a clamping mechanism electrically connecting the first housing part to the high-voltage transmission line;
   an antenna connected to the electronics, extending from the body, and transmitting a fault notification signal to a central station; and
   a corona ring proximal to a tip of the antenna, the corona ring connected to a ground of the electronics, the tip of the antenna extends into an aperture defined by the corona ring.

2. The device of claim 1, wherein the body has a clip or clamp shape.

3. The device of claim 1, wherein the first housing part forms an electronics compartment housing the electronics.

4. The device of claim 3, wherein the first housing part is a Faraday cage that shields the electronics from an external electromagnetic interference.

5. The device of claim 4, wherein the body has a second housing part formed of a non-conductive plastic.

6. The device of claim 5, wherein the second housing part protects the electronics compartment from a plurality of external environmental elements.

7. The device of claim 1, further comprising a cover made of a non-conductive plastic attached to the body.

8. The device of claim 7, wherein the cover encloses and protects the antenna and the corona ring.

9. The device of claim 1, wherein the electronics measure a current and a voltage of the high-voltage transmission line.

10. The device of claim 9, wherein the electronics identify the potential fault and a real fault and calculate based on the current and the voltage.

11. The device of claim 9, wherein the electronics calculate a load in the high-voltage transmission line.

12. The device of claim 3, further comprising a power source that supplies power to the electronics and is housed in the electronics compartment.

13. The device of claim 12, wherein the power source is a battery.

14. The device of claim 12, wherein the power source is a mechanism to harvest energy from the high-voltage transmission line.

15. The device of claim 1, wherein, in a state attached to the high-voltage transmission line, the antenna is positioned vertically at a distal end of the body opposite the high-voltage transmission line.

16. The device of claim 1, wherein the fault notification signal is transmitted to the central station according to at least one of the following communications standards: 2G, 3G, 4G, 4G LTE, 5G and Wi-Fi.

17. The device of claim 1, wherein the corona ring is formed of copper.

18. The device of claim 1, wherein the corona ring forms a closed circle concentric to the antenna.

19. The device of claim 1, wherein the device functions on the high-voltage transmission line with an allowable voltage range up to 69 kV.

20. The device of claim 1, wherein the high-voltage transmission line is an overhead transmission line.

* * * * *